US008138876B2

(12) United States Patent
Ding et al.

(10) Patent No.: US 8,138,876 B2

(45) Date of Patent: Mar. 20, 2012

(54) ON-CHIP INTEGRATED VOLTAGE-CONTROLLED VARIABLE INDUCTOR, METHODS OF MAKING AND TUNING SUCH VARIABLE INDUCTORS, AND DESIGN STRUCTURES INTEGRATING SUCH VARIABLE INDUCTORS

(75) Inventors: Hanyi Ding, Essex Junction, VT (US); Essam F. Mina, South Burlington, VT (US); Wayne H. Woods, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 200 days.

(21) Appl. No.: 12/021,339

(22) Filed: Jan. 29, 2008

(65) Prior Publication Data

US 2009/0189725 A1 Jul. 30, 2009

(51) Int. Cl.

| | |
|---|---|
| ***H01F 5/00*** | (2006.01) |
| ***H01F 27/28*** | (2006.01) |
| ***H01F 7/06*** | (2006.01) |
| ***H01L 27/08*** | (2006.01) |
| ***H03H 7/00*** | (2006.01) |

(52) U.S. Cl. ....... 336/200; 336/223; 336/232; 29/602.1; 257/531; 333/174

(58) Field of Classification Search .................. 257/531; 333/174; 336/137, 200, 223, 232; 29/602.1
See application file for complete search history.

(56) References Cited

U.S. PATENT DOCUMENTS

| | | | | |
|---|---|---|---|---|
| 5,095,357 | A | 3/1992 | Andoh et al. | |
| 5,629,553 | A | 5/1997 | Ikeda et al. | |
| 6,121,850 | A | 9/2000 | Ghoshal | |
| 6,437,653 | B1 | 8/2002 | Cruz et al. | |
| 6,556,416 | B2 * | 4/2003 | Kunihiro | 361/277 |
| 6,714,113 | B1 * | 3/2004 | Abadeer et al. | 336/223 |
| 6,794,978 | B2 | 9/2004 | Zhang et al. | |
| 2001/0013626 | A1 * | 8/2001 | Fujii | 257/379 |
| 2005/0068146 | A1 | 3/2005 | Jessie | |
| 2006/0055470 | A1 | 3/2006 | Luong et al. | |

(Continued)

FOREIGN PATENT DOCUMENTS

JP 05267913 A * 10/1993

(Continued)

OTHER PUBLICATIONS

IBM Technical Disclosure Bulletin, Fabricating Miniature Strip Lines, Mar. 1970, IBM Corportion, vol. 12, Issue 10, pp. 1637-1638.*

(Continued)

*Primary Examiner* — Elvin G Enad
*Assistant Examiner* — Tsz Chan
(74) *Attorney, Agent, or Firm* — Wood, Herron & Evans, LLP

(57) ABSTRACT

On-chip integrated variable inductors, methods of making and tuning an on-chip integrated variable inductor, and design structures embodying a circuit containing the on-chip integrated variable inductor. The inductor generally includes a signal line configured to carry an electrical signal, a ground line positioned in proximity to the signal line, and at least one control unit electrically coupled with the ground line. The at least one control unit is configured to open and close switch a current path connecting the ground line with a ground potential so as to change an inductance of the signal line.

26 Claims, 10 Drawing Sheets

U.S. PATENT DOCUMENTS

2006/0139138 A1* 6/2006 Watanabe et al. ............. 336/200
2009/0167502 A1* 7/2009 Erickson et al. ............. 340/10.3

FOREIGN PATENT DOCUMENTS

JP 2006059955 A * 3/2006

OTHER PUBLICATIONS

Okada, et al., "On-Chip High-Q Variable Inductor Using Wafer-Level Chip-Scale Package Technology", IEEE Transactions on Electronic Devices, vol. 53, No. 9, Sep. 2006, pp. 2401-2406.

Jeong, et al., "Tunable Impedance Transformer Using a Transmission Line with . . . ", IEEE Transactions on Microwave Theory and Techniques, vol, 53, No. 8, Aug. 2005, pp. 2587-2593.

Park, et al., "Variable Inductance Multilayer Inductor With MOSFET Switch Control", IEEE Electron Device Letters, vol. 25, No. 3, Mar. 2004, pp. 144-146.

Pham, et al. "On-Chip Variable Inductor Using MOSFET Switches", Microwave Conference, 2005 European vol. 2, Oct. 4-6, 2005 (4 Pages).

* cited by examiner

ON-CHIP INTEGRATED VOLTAGE-CONTROLLED VARIABLE INDUCTOR, METHODS OF MAKING AND TUNING SUCH VARIABLE INDUCTORS, AND DESIGN STRUCTURES INTEGRATING SUCH VARIABLE INDUCTORS

FIELD OF THE INVENTION

The invention relates generally to integrated circuits and, in particular, to on-chip integrated variable inductors for integrated circuits, design structures embodying the on-chip integrated variable inductors, methods for fabricating on-chip integrated variable inductors, and methods for tuning an on-chip integrated variable inductor during circuit operation.

BACKGROUND OF THE INVENTION

Inductors are passive electrical devices found in many integrated circuits, including radiofrequency integrated circuits (RFICs), multiple band passive matching networks, multiple band voltage control oscillator (VCO) tank circuits, and phase delay units. Inductors may be used singularly in an integrated circuit or arranged in pairs as differential inductors or transformers in the integrated circuit. In general, an inductor is a reactive element that can store energy in its magnetic field and tends to resist a change in the amount of current flowing through it. The performance of an inductor significantly affects the overall performance of the related integrated circuit and may even be a performance limiting component. On-chip or monolithic inductors are commonly fabricated on the same substrate as the remainder of the related integrated circuit. Inductors can be fabricated with a conventional metal-oxide-semiconductor (MOS) process or advanced Silicon Germanium (SiGe) processes.

Important parameters of on-chip inductors include inductance, Q (the quality factor), self-resonant frequency (inductance and capacitance values), and the chip area, all of which need to be optimized in the circuit design. The quality factor Q is a commonly accepted indicator of inductor performance in an integrated circuit and represents a measure of the relationship between energy loss and energy storage in an inductor. A high value for Q reflects a low substrate loss and a low series resistance.

On-chip inductors, which may take either a planar form (including line and planar spiral types) or a spiral form, may have either a fixed inductance or a variable inductance. Mixed signal and radio frequency applications commonly require variable reactive elements (e.g., inductors or capacitors) to achieve tuning, band switching, phase locked loop functions, etc. Such reactive elements are used in some type of circuit where the reactive element is resonated with another reactive element. The desired result is a resonant circuit that has a response that can be tuned from one frequency to another dynamically. One approach is to build the ability to switch an additional length of conductor into the signal line of an on-chip variable inductor into the circuit design. The additional length of conductor can be connected either serially or in parallel with the original length of conductor. Lengthening the signal line of the inductor alters its inductance value. However, conventional arrangements require some type of switch in the signal line of the variable inductor, which may deteriorate the Q value to an unacceptably low value for many mixed signal and radio frequency applications.

Consequently, improved constructions for an on-chip variable inductor are needed that overcome without these and other deficiencies of conventional variable inductors.

SUMMARY OF THE INVENTION

In one embodiment, an on-chip integrated variable inductor comprises a signal line configured to carry an electrical signal, a ground line positioned proximate to the signal line, and at least one control unit disposed in a current path connecting the ground line with a ground potential. The at least one control unit is configured to selectively open and close the current path such that the signal line has a first inductance value when the current path is open and a second inductance value when the current path is closed to couple the ground line with the ground potential.

The signal line of the on-chip integrated variable inductor is electrically coupled with an integrated circuit carried on the chip. The inductance value of the on-chip integrated variable inductor can be modified without altering the signal path, lengthening the signal line, or installing a switch into the signal line. Instead, the inductance value of the variable inductor can be modified or tuned, while the integrated circuit on the chip is powered and operating, by grounding one or more ground lines disposed proximate to the signal line.

In another embodiment, a method is provided for making a variable on-chip integrated inductor. The method comprises fabricating a signal line on a chip that is electrically coupled with an integrated circuit on the chip. The method further comprises fabricating a ground line sufficiently proximate to the signal line such that the signal line has a first inductance value when the ground line is coupled in a current path with a ground potential and a second inductance value when the current path is open. The method further comprises fabricating at least one control unit configured for selectively opening and closing the current path. The ground line and signal line may be disposed in a common metallization level or may be positioned in different metallization levels.

In yet another embodiment, a method is provided for tuning an on-chip integrated variable inductor during the operation of an integrated circuit electrically coupled with the variable inductor. The method comprises directing an electrical signal from the integrated circuit through a signal line of the variable inductor. The method further comprises selectively grounding at least one ground line sufficiently proximate to the signal line to alter an inductance value of the signal line.

In yet another embodiment, a design structure is provided that is embodied in a machine readable medium for designing and manufacturing a circuit. The circuit comprises an on-chip integrated variable inductor including a signal line configured to carry an electrical signal and a ground line positioned proximate to the signal line. The circuit further comprises at least one control unit disposed in a current path connecting the ground line with a ground potential. The at least one control unit is configured to selectively open and close the current path such that the signal line has a first inductance value when the current path is open and a second inductance value when the current path is closed to couple the ground line with the ground potential. The circuit and circuit structure reside in design files or design structures (e.g. GDSII files), which can be transferred to design houses, manufacturers, customers, or another third party.

DETAILED DESCRIPTION

Figure 1A:
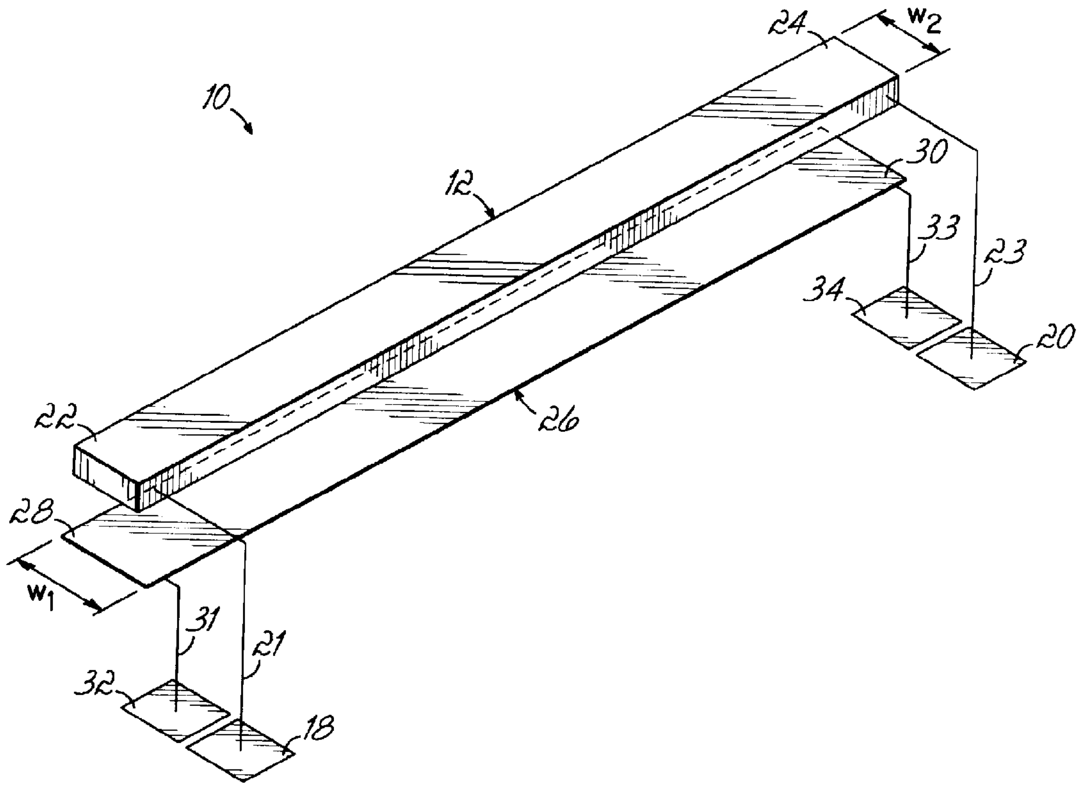
FIG. 1A is perspective view of an on-chip integrated variable inductor constructed with a signal line and a switched ground line in accordance with an embodiment of the invention and in which the surrounding dielectric material is omitted for clarity.
Figure 1B:
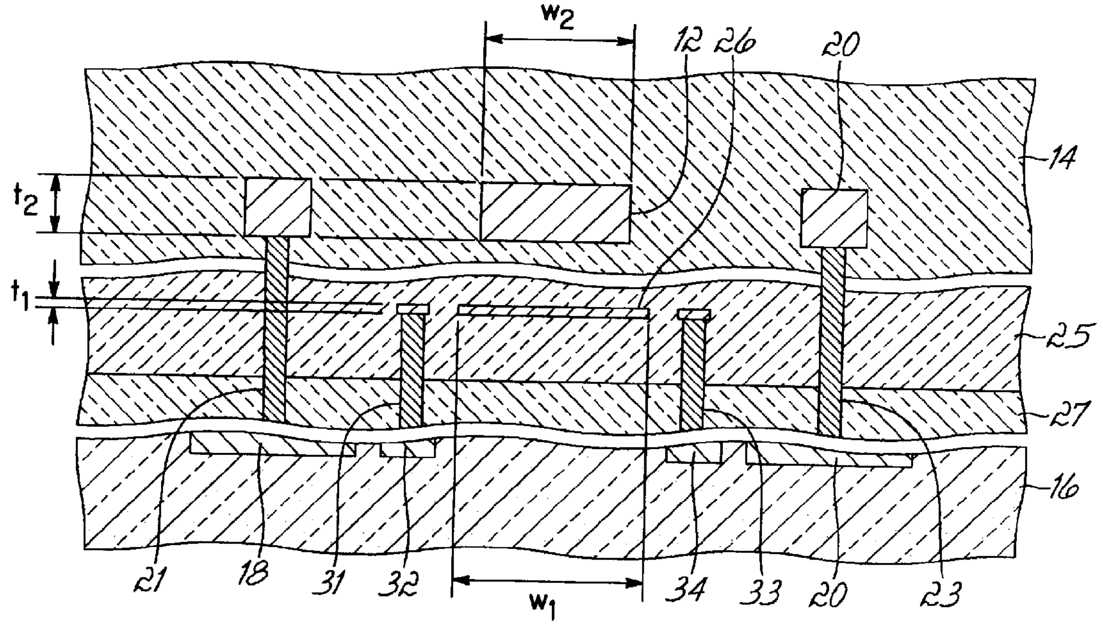
FIG. 1B is a cross sectional view of the inductor of FIG. 1A.

With reference to FIGS. 1A and 1B, an on-chip integrated variable inductor, which is generally indicated by reference numeral 10, consists of a signal line 12 in the representative form of a strip of a conductive material that is buried in, and surrounded by, an insulating layer 14 (FIG. 1B) of a dielectric material. The inductor 10 is carried on a substrate 16, which includes at least one integrated circuit formed thereon and/or therein with devices having features, of which features 18, 20 are representative, that are contacted with the signal line 12. The features 18, 20 may comprise metallization lines, a contact, a semiconductor material, and/or features of circuit elements previously formed on and/or in the substrate 16. The substrate 16 is typically a chip or die comprising a piece of a semiconductor wafer containing an entire integrated circuit.

Ports or terminals 22, 24 located at opposite ends of the signal line 12 are electrically coupled by conductive paths 21, 23 in the insulating layer 14 and in any intervening dielectric layers, such as dielectric layers 25, 27, with the features 18, 20 on the substrate 16. An electrical signal is communicated from the integrated circuit on the substrate 16 to the signal line 12. Alternatively, the terminals 22, 24 may be coupled by conductive paths in overlying metallization levels (not shown) with another circuit on the substrate 16.

A ground line 26 of the inductor 10 is disposed between the signal line 12 and the substrate 16. Ground line 26 is linear strip of a conductive material that is buried in, and surrounded by, an insulating layer 25 (FIG. 1B). The ground line 26, which generally underlies the signal line 12, is separated from the signal line 12 by a portion of the dielectric material of at least insulating layers 14, 25, which supplies electrical isolation. In the representative embodiment, the inductor 10 only includes one signal line 12 and the ground line 26 is aligned substantially parallel with the signal line 12.

Opposite ends of the ground line 26 constitute contacts 28, 30 that are electrically coupled in a selective manner by control units 32, 34, respectively, with ground. The control units 32, 34, which are illustrated as residing on substrate 16, are physically coupled with the contacts 28, 30 by conductive paths 31, 33 in insulating layer 25, and any other intervening dielectric layers such as insulating layer 27. Control units 32, 34 can be any voltage-controlled device, but are not limited to, field effect transistors, such as a p-type metal-oxide-semiconductor (PMOS) transistor or an n-type metal-oxide-semiconductor (NMOS) transistor, and positive-intrinsic-negative (p-i-n) diodes, which have constructions understood by a person having ordinary skill in the art. When both control units 32, 34 are opened by appropriate voltage control signals, the ground line 26 represents an open circuit and is electrically floating. When the control units 32, 34 are in the open state, the presence of the ground line 26 does not significantly affect the inductance of the signal line 12. When both control units 32, 34 are closed by appropriate voltage control signals, the ground line 26 is placed in a closed circuit coupled by a short circuit to a ground potential. The proximity of the grounded ground line 26 to the signal line 12 alters the inductance of the inductor 10, as further described below.

In an alternative embodiment, one of the contacts 28, 30 of the ground line 26 may be continuously tied with the ground potential and only the other of the contacts 28, 30 of the ground line 26 switched to complete the closed circuit to ground. In another alternative embodiment, the ground line 26 may be segmented and additional control units may be added to selectively couple the segments together to adjust the effective length of the ground line 26. For example, the ground line 26 may include a central contact (not shown) near the mid-point between contacts 28, 30 and an additional control unit (not shown) for the central contact so that the inductor 10 has more than two inductance states when different contact combinations are selected.

Operation of the control units 32, 34 is effective to alter the inductance value of inductor 10 by coupling the ground line 26 with ground. When the control units 32, 34 are closed and the ground line 26 is electrically coupled by conductive paths 31, 33 with ground, the proximity of the ground line 26 to the signal line 12 reduces the inductance value of the inductor 10. The reduction in inductance is binary in that the inductor 10 has a first inductance value when the control units 32, 34 are open and a second inductance value, which is less than the first inductance value, when the control units 32, 34 are closed. When the control units 32, 34 are closed, the ground line 26 becomes the return of the inductor 10. Inductor 10 is electronically tunable by voltage signals in that the control units 32, 34 can be opened and closed during the operation of the integrated circuit on substrate 16.

The width, $w_1$, of the ground line 26 can be greater than the width, $w_2$, of the signal line 12, which may operate to reduce coupling with the substrate 16. In one embodiment, the width, $w_1$, of the ground line 26 can be equal to the product of the width, $w_2$, of the signal line 12 and twice the separation between the signal and ground lines 12, 26. Alternatively, the signal and ground lines 12, 26 can have approximately the same width or the ground line 26 can be narrower than the signal line 12. Reducing the width, $w_1$, of the ground line 26 lessens the reduction in the inductance when the control units 32, 34 are closed to connect the ground line 26 with ground. The signal and ground lines 12, 26 are characterized by an aspect ratio representing the ratio of line thickness to line width. Generally, the thickness, $t_1$, of the ground line 26 is smaller than the thickness, $t_2$, of the signal line 12, which results in a smaller aspect ratio for ground line 26 in comparison with the signal line 12. The lengths of the signal and ground lines 12, 26 are approximately equal. The dimensions of the signal and ground lines 12, 26 are selected when the integrated circuit associated with the inductor 10 is designed.

Signal line 12 and ground line 26 are features in a stratified stack of interconnected metal lines and vias fabricated on substrate 16 by conventional back end of line (BEOL) processing, such as damascene and dual-damascene processes, and defining an interconnect structure for an integrated circuit on the substrate 16. For example, signal line 12 may be a metal line disposed an M5-level or an M6-level and the ground line 26 may be a metal line disposed in an M2-level closer to the substrate 16 than the metallization level for the ground line 12. As a consequence, insulating layer 14 is typically separated from insulating layer 25 by intervening insulating layers (not shown) that also contain conductive features of the interconnect structure. Typically, metallization features formed by BEOL processing in upper metallization levels are thicker than metallization features formed in lower metallization levels, which implies that the signal line 12 may be thicker than the ground line 26.

In a typical fabrication sequence, features 18, 20 and control units 32, 34, as well as the integrated circuit associated with the inductor 10, are formed in and on the substrate 16 by conventional front end of line (FEOL) processing, i.e., processing associated with the fabrication of the semiconductor devices of the integrated circuit in the course of device manufacturing up to the first M1-level. BEOL processing is used to form each of the metallization levels (M2-level, M3-level, etc.) overlying the M1-level. In particular, BEOL processing is used to form the signal line 12 in a lower metallization level and the ground line 26 in an upper metallization level, as well as metal-filled vias and conductive lines defining the conductive paths 21, 23, 31, 33.

To that end, insulating layer 27 is applied and processed by BEOL processing to define metal-filled vias and conductive lines, some of which participate in defining conductive paths 21, 23, 31, 33. Insulating layer 25 is applied on insulating layer 27, vias and trenches (including a trench for ground line 26) are defined in the insulating layer 25 using known lithography and etching techniques, and the trenches and vias are filled with a desired conductor. Any excess overburden of conductor remaining after the filling step is removed by planarization, such as by a chemical mechanical polishing (CMP) process. Intervening metallization layers, if any, are applied using BEOL processing. Insulating layer 14 is applied, vias and trenches (including a trench for signal line 12) are defined in the insulating layer 14 using known lithography and etching techniques, and the trenches and vias are filled with a desired conductor. Any excess overburden of conductor remaining after the filling step is removed by planarization, such as by a CMP process. Overlying metallization layers, if any, are then applied using BEOL processing to complete the interconnect structure.

In an alternative embodiment of the invention, the ground line 26 may be formed in the M1-level during FEOL processing. Then, the upper metallization levels, including the metallization level containing the signal line 12, are applied as described above.

Insulating layers 14, 25, 27 may comprise any organic or inorganic dielectric material recognized by a person having ordinary skill in the art, which may be deposited by any of number of well known conventional techniques such as sputtering, spin-on application, chemical vapor deposition (CVD) process or a plasma enhanced CVD (PECVD) process. Candidate inorganic dielectric materials for insulating layers 14, 25, 27 may include, but are not limited to, silicon dioxide, fluorine-doped silicon glass (FSG), and combinations of these dielectric materials. The dielectric material constituting insulating layers 14, 25, 27 may be characterized by a relative permittivity or dielectric constant smaller than the dielectric constant of silicon dioxide, which is about 3.9. Candidate low-k dielectric materials for insulating layers 14, 25, 27 include, but are not limited to, porous and nonporous spin-on organic low-k dielectrics, such as spin-on aromatic thermoset polymer resins, porous and nonporous inorganic low-k dielectrics, such as organosilicate glasses, hydrogen-enriched silicon oxycarbide (SiCOH), and carbon-doped oxides, and combinations of organic and inorganic dielectrics. Fabricating the insulating layers 14, 25, 27 from such low-k materials may operate to lower the capacitance of the completed interconnect structure as understood by a person having ordinary skill in the art.

Suitable conductive materials for the signal line 12 and ground line 26 include, but are not limited to, copper (Cu), aluminum (Al), alloys of these metals, and other similar metals. These metals may be deposited by conventional deposition processes including, but not limited to a CVD process and an electrochemical process like electroplating or electroless plating. A barrier layer (not shown) may clad one or more sides of the signal line 12 and ground line 26. The barrier layer may comprise, for example, a bilayer of titanium and titanium nitride or a bilayer of tantalum or tantalum nitride applied by conventional deposition processes. The conductive paths 21, 23, 31, 33 may be composed of the same materials as the signal line 12 and the ground line 26, and additional types of materials such as tungsten (W) and metal silicides, as understood by a person having ordinary skill in the art.

Substrate 16 may be a semiconductor wafer composed of a semiconductor material including, but not limited to, silicon (Si), silicon germanium (SiGe), a silicon-on-insulator (SOI) layer, and other like Si-containing semiconductor materials. Alternatively, substrate 16 may comprise a ceramic substrate, such as a quartz wafer or an AlTiC ($Al_2O_3$—TiC) wafer, or another type of substrate, such as a III-V compound semiconductor substrate, known to a person having ordinary skill in the art.

In use and with continued reference to FIGS. 1A and 1B, the inductor 10 has a first inductance value when the control units 32, 34 are switched open to place the ground line 26 in an electrically floating condition. During operation of the associated integrated circuit containing the inductor 10 and based upon a need to tune the inductance of the inductor 10, the integrated circuit communicates voltage signals over appropriate control lines (not shown) to the control units 32,

34. The voltage signals are effective to cause the control units 32, 34 to change state and close a current path connecting the ground line 26 through conductive paths 31, 33 to ground. For example, the voltage signal may electrically bias a field effect transistor or a p-i-n diode operating as control units 32, 34 to conduct current between the respective source/drain regions, which connects the ground line 26 in the closed current path with a ground potential. Grounding the ground line 26 operates to reduce the inductance of the inductor 10 to a second inductance value that is lower than the first inductance value. As a result, the inductance of inductor 10 can be actively tuned while the associated integrated circuit is operating and, therefore, the change in inductance is programmable.

Figure 2A:
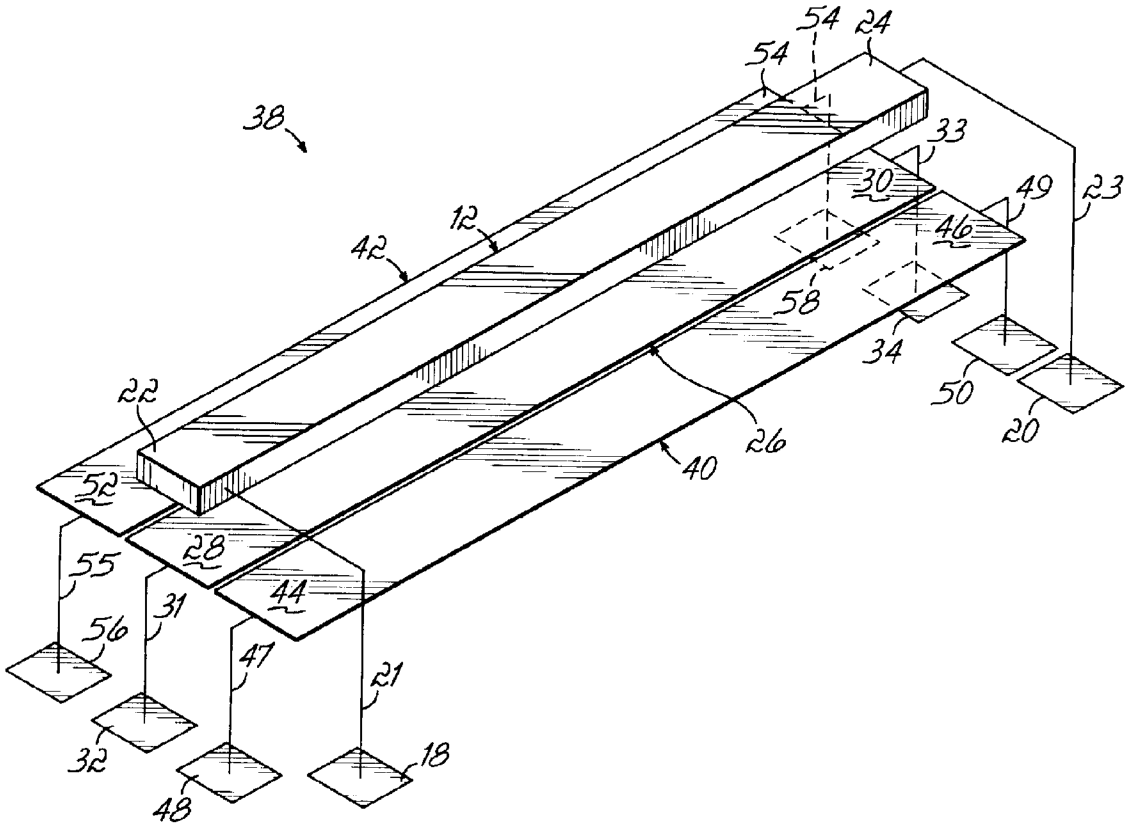
FIGS. 2A and 2B are perspective and cross-sectional views similar to FIGS. 1A and 1B of an on-chip integrated variable inductor constructed with a signal line and multiple switched ground lines in accordance with an alternative embodiment of the invention.
Figure 2B:
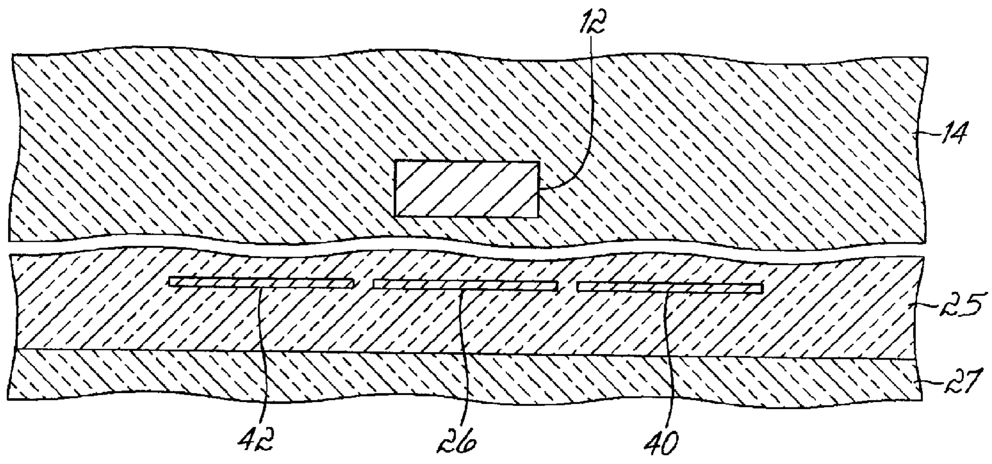

With reference to FIGS. 2A, 2B in which like reference numerals refer to like features in FIGS. 1A, 1B and in accordance with an alternative embodiment of the invention, an on-chip integrated variable inductor 38 modifies the construction of inductor 10 (FIGS. 1A, 1B) to incorporate multiple ground lines by introducing ground lines 40, 42 in addition to ground line 26. Similar to ground line 26, ground lines 40, 42 are linear strips of a conductive material that are buried in the insulating layer 14 such that ground line 26 is flanked on one side by ground line 40 and on the opposite side by ground line 42. Ground lines 40, 42 are also disposed between the signal line 12 and the substrate 16 and reside in the same metallization level as ground line 26 and are formed as described above with regard to ground line 26.

The ground lines 40, 42 are electrically isolated from each other, from ground line 26, and from signal line 12 by portions of the dielectric material of insulating layer 14. The ground lines 40, 42 are also formed by the same BEOL process techniques and from the same BEOL metallurgy as ground line 26 and are typically formed concurrently with ground line 26. Ground lines 40, 42 can have dimensional relationships with the signal line 12 similar to the dimensional relationships between signal line 12 and ground line 26. However, the widths and/or thicknesses of the individual ground lines 26, 40, 42 may differ.

Opposite ends of the ground line 26 constitute contacts 28, 30 that are electrically coupled in a selective manner by control units 32, 34, respectively, in current paths with ground. The control units 32, 34, which are illustrated as residing on substrate 16, are physically coupled with the contacts 28, 30 by conductive paths 31, 33 in insulating layer 25, and any other intervening dielectric layers such as insulating layer 27.

Opposite ends of the ground line 40 constitute contacts 44, 46 that are electrically coupled in a selective manner by control units 48, 50, respectively, with ground. Opposite ends of the ground line 42 constitute contacts 52, 54 that are electrically coupled in a selective manner by control units 56, 58, respectively, with ground. Control units 48, 50 and control units 56, 58, which have a construction analogous to the control units 32, 34, operate to selectively connect the respective ground lines 40, 42 in discrete, isolated current paths with ground, when concurrently closed, in a manner similar to the operation of control units 32, 34 with respect to ground line 26. Control units 48, 50, 56, 58 may be located on substrate 16 and coupled with the respective ground lines 40, 42 by conductive paths (not shown) similar to conductive paths, 31, 33 (FIG. 1B). For simplicity of illustration, conductive paths 21, 23, 31, 33 are omitted from FIG. 2B.

Operation of control units 32, 34, control units 48, 50, and control units 56, 58 is effective to alter the inductance of inductor 38 by coupling the ground lines 26, 40, 42 individually with ground or, alternatively, by coupling different combinations of the ground lines 26, 40, 42 with ground. When one or more of the sets of control units 32, 34, control units 48, 50, or control units 56, 58 are closed, the proximity of the grounded one or more of the ground lines 26, 40, 42 to the signal line 12 reduces the inductance of the inductor 38. The number of different reductions in the inductance is proportional to the number of switched ground lines 26, 40, 42, in contrast to the binary tenability of inductor 10 (FIGS. 1A, 1B). For example, the selective grounding of three ground lines 26, 40, 42 permit the inductor 38 to have eight different inductance values that can be selected by merely opening and closing control units 32, 34, control units 48, 50, control units 56, 58, and combinations thereof.

Figure 3A:
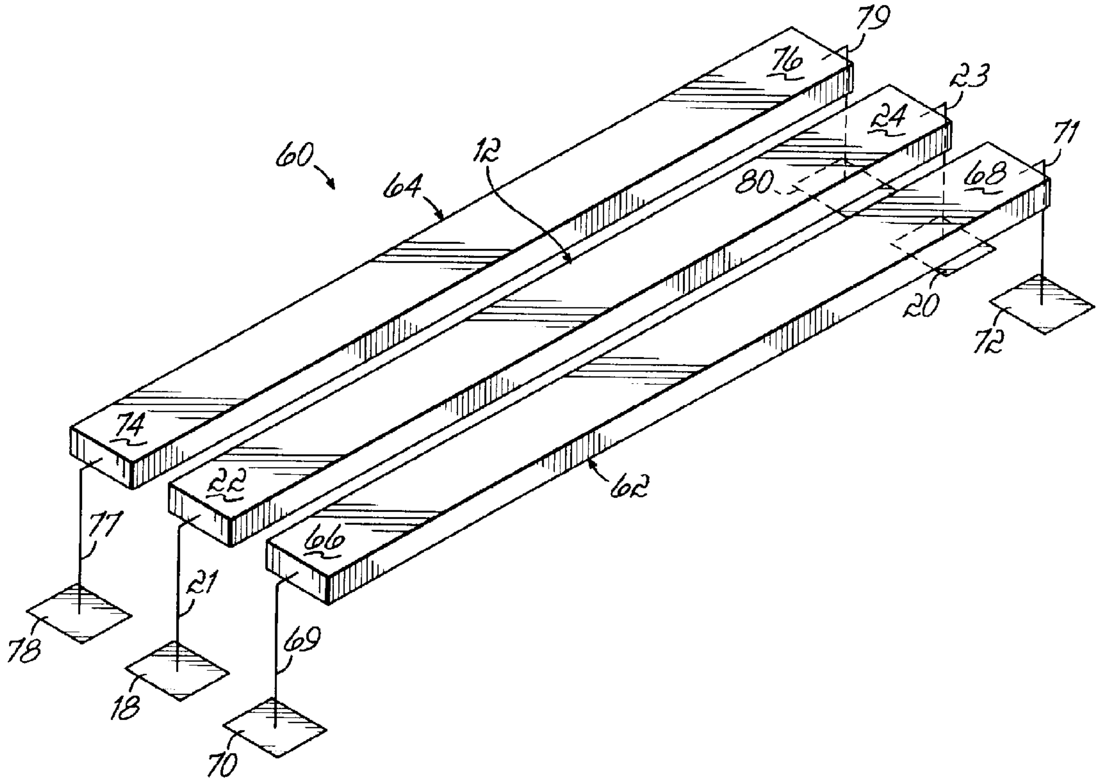
FIGS. 3A and 3B are perspective and cross-sectional views similar to FIGS. 1A and 1B of an on-chip integrated variable inductor constructed with a signal line and multiple switched ground lines physically disposed in a single metallization level in accordance with an alternative embodiment of the invention.
Figure 3B:
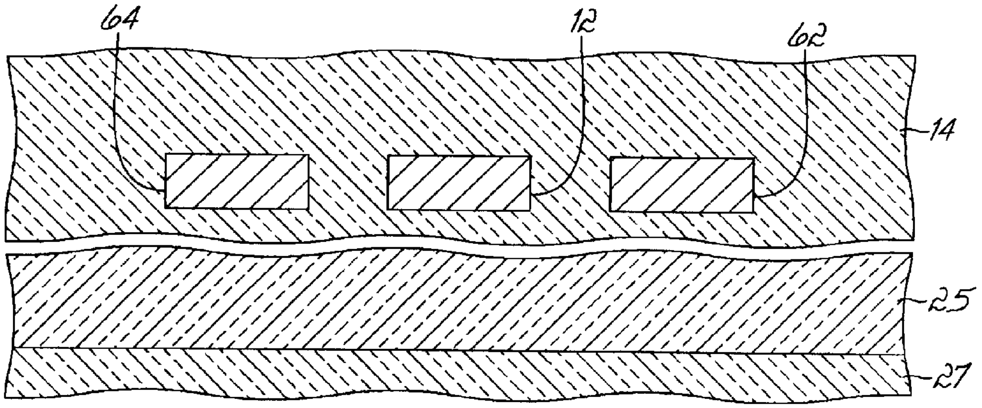

With reference to FIGS. 3A, 3B in which like reference numerals refer to like features in FIGS. 1A, 1B and in accordance with an alternative embodiment of the invention, an on-chip integrated variable inductor 60 includes ground lines 62, 64 instead of ground line 26 found in inductor 10 (FIGS. 1A, 1B). Similar to ground line 26, ground lines 62, 64 consist of linear strips of a conductive material that are buried in the insulating layer 14 such that signal line 26 is flanked on one side by ground line 62 and on the opposite side by ground line 64. Ground lines 62, 64 reside in the same metallization level as signal line 12. The ground lines 62, 64 are electrically isolated from each other and from signal line 12 by portions of the insulating layer 14. The ground lines 62, 64 are also formed by the same BEOL process techniques and from the same BEOL metallurgy as signal line 12 and are typically formed simultaneously with signal line 12. Ground lines 62, 64 can have dimensional relationships with the signal line 12 similar to the dimensional relationships between signal line 12 and ground line 26 (FIGS. 1A, 1B). However, each of the ground lines 62, 64 can have different widths.

Opposite ends of the ground line 62 constitute contacts 66, 68 that are electrically coupled in a selective manner by control units 70, 72, respectively, in a current path with ground. Opposite ends of the ground line 64 constitute contacts 74, 76 that are electrically coupled in a selective manner by control units 78, 80, respectively, in another current path with ground. Control units 70, 72 and control units 78, 80, which have a construction analogous to the control units 32, 34, operate to selectively couple the respective ground lines 62, 64 in discrete, isolated current paths with ground, when concurrently closed, in a manner similar to the operation of control units 32, 34 with respect to ground line 26. Control units 70, 72, 78, 80 may be located on substrate 16 and coupled with the respective ground lines 62, 64 by conductive paths (not shown) similar to conductive paths 31, 33 (FIG. 1B). For simplicity of illustration, conductive paths 21, 23, 31, 33 are omitted from FIG. 3B.

Operation of control units 70, 72 and control units 78, 80 is effective to alter the inductance of inductor 60 by coupling the ground lines 62, 64 individually with ground or, alternatively, by coupling both of the ground lines 62, 64 with ground. When one or both of the sets of control units 70, 72 or control units 78, 80 are closed, the proximity of the grounded ground lines 62, 64 to the signal line 12 reduces the inductance of the inductor 60. The selective grounding of ground lines 62, 64 permit the inductor 60 to have three different inductance values that can be selected by merely opening and closing control units 70, 72 and control units 78, 80.

Figure 6A:
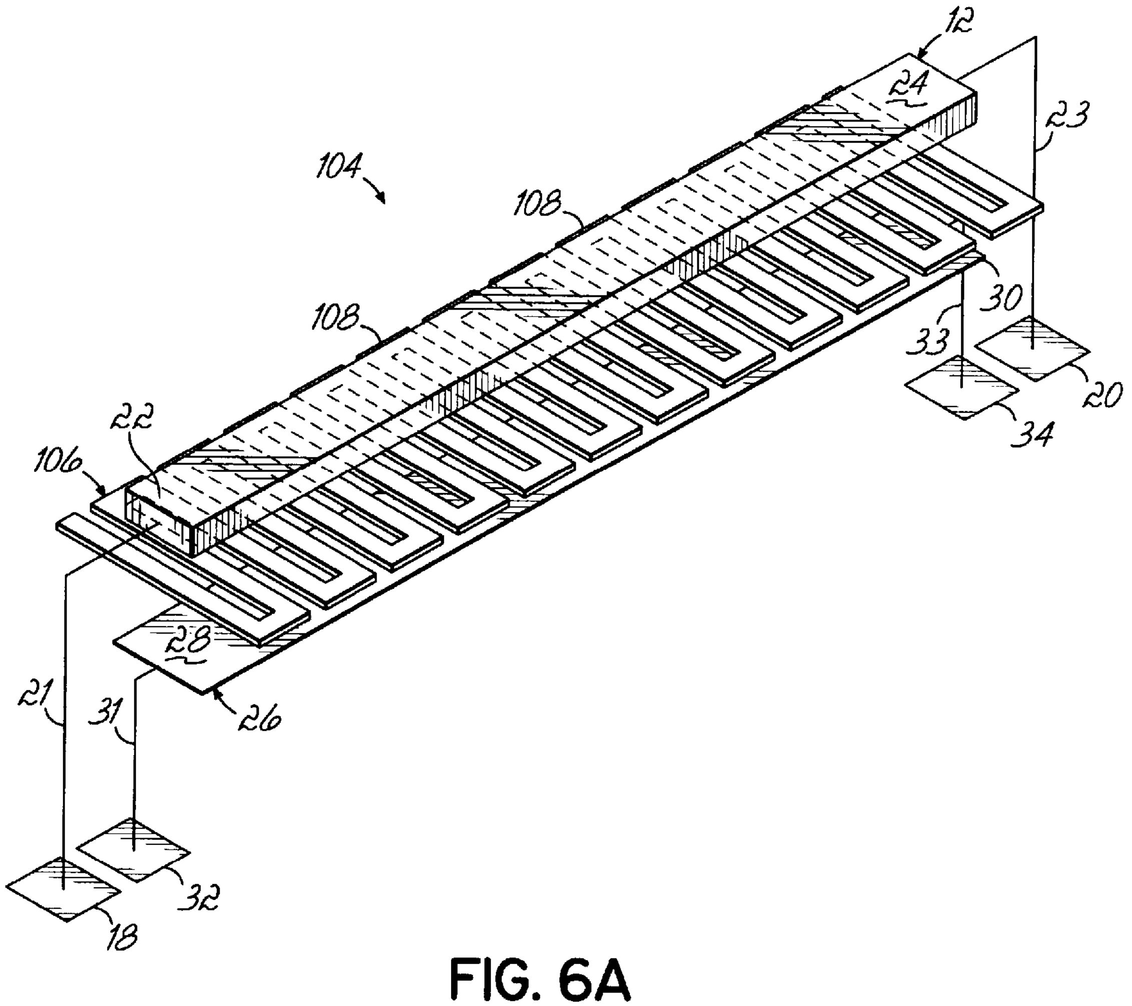
FIGS. 6A and 6B are perspective and cross-sectional views similar to FIGS. 1A and 1B of an on-chip integrated variable inductor constructed in accordance with an alternative embodiment of the invention and in which a capacitance shield is disposed between the signal and ground lines.
Figure 6B:
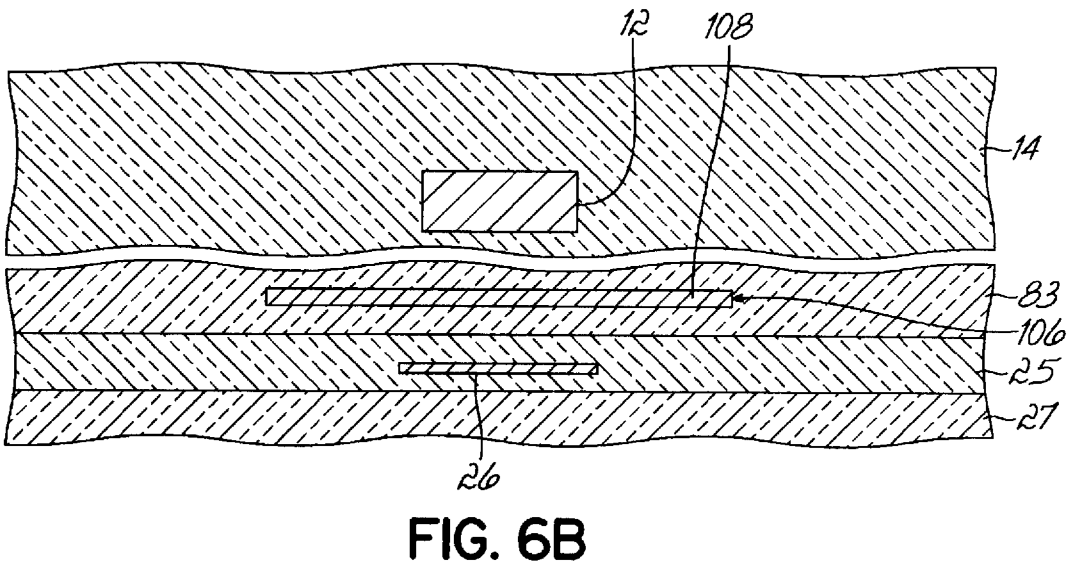

In an alternative embodiment, a capacitance shield (not shown) may be defined using a chain of vias disposed between one or both of the ground lines 62, 64 and the signal line 12. This optional capacitance shield operates in a manner similar to capacitance shield capacitance shield 106 (FIGS. 6A, 6B).

Figure 4A:
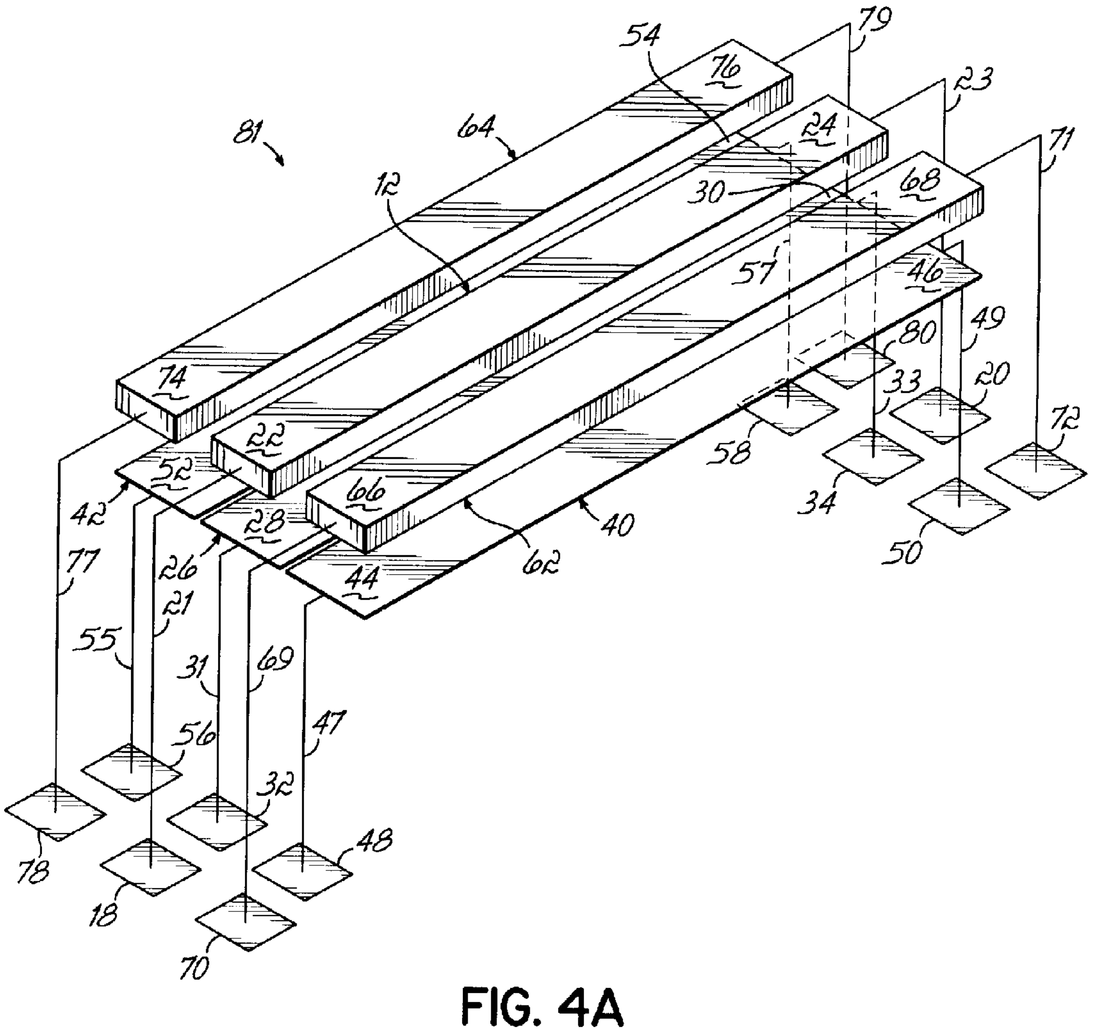
FIGS. 4A and 4B are perspective and cross-sectional views similar to FIGS. 1A and 1B of an on-chip integrated variable inductor constructed with a signal line and multiple switched ground lines physically disposed in different metallization levels in accordance with an alternative embodiment of the invention.
Figure 4B:
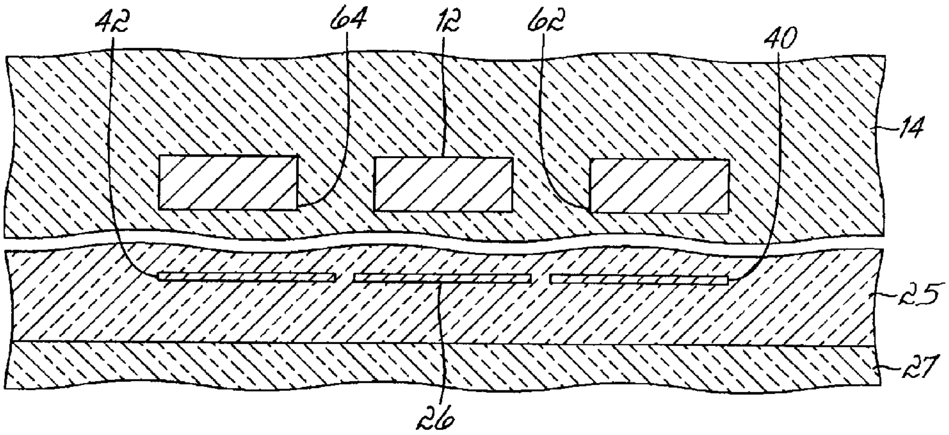

With reference to FIGS. 4A, 4B in which like reference numerals refer to like features in FIGS. 2A, 2B and 3A, 3B, and in accordance with an alternative embodiment of the invention, an on-chip integrated variable inductor 81 includes ground lines 26, 40, 42 that are in a different metallization level as the signal line 12 and ground lines 62, 64 that are in the same metallization level as the signal line 12. By connecting different ground lines 26, 40, 42, 62, 64 or permutations and combinations therefore, the inductance of inductor 81 can be switched to multiple different inductance values proportional to their number. In one embodiment, ground line 26 can be switched to ground and the other ground lines 40, 42, 62, 64 switched either singularly or in combination to tune the inductor 81. In this embodiment, the inductor 81 is tunable both vertically and horizontally. For simplicity of illustration, conductive paths 21, 23, 31, 33 are omitted from FIG. 4B.

Figure 5A:
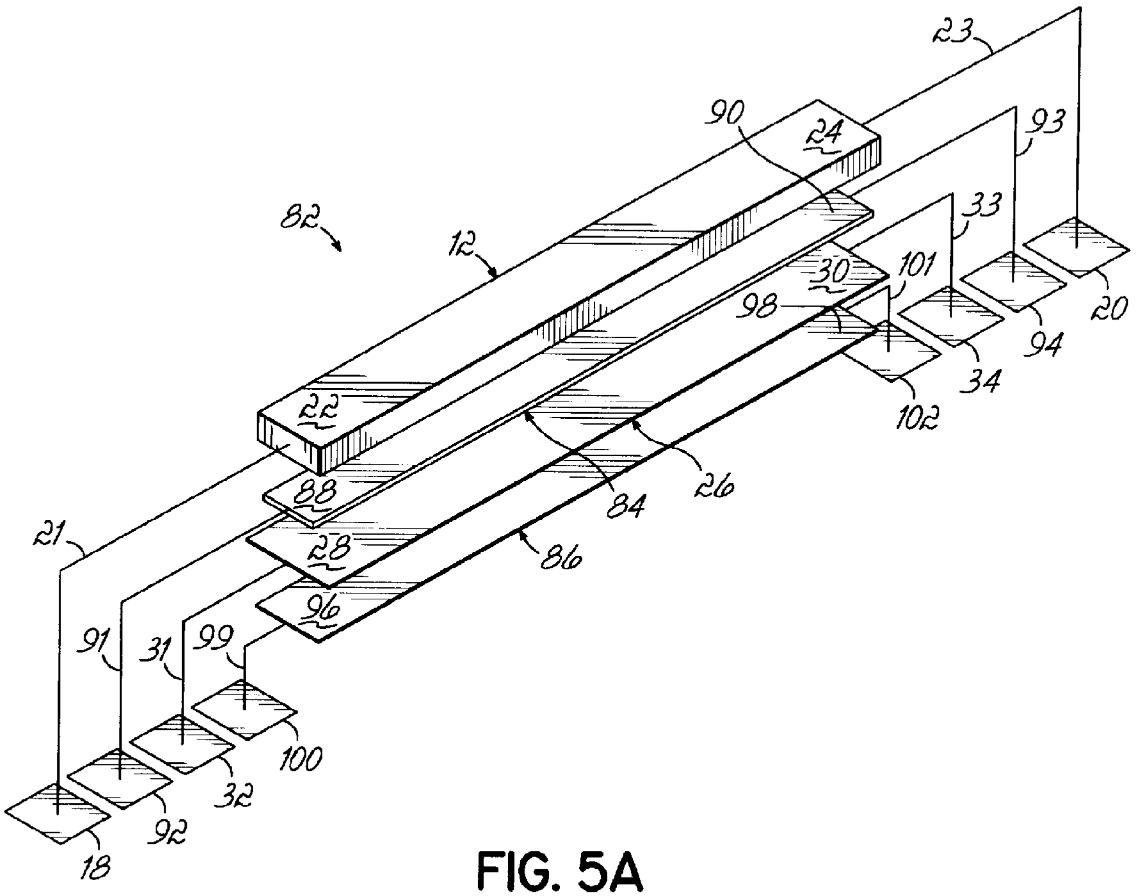
FIGS. 5A and 5B are perspective and cross-sectional views similar to FIGS. 1A and 1B of an on-chip integrated variable inductor constructed with a signal line and a stack of switched ground lines physically disposed in different metallization levels in accordance with an alternative embodiment of the invention.
Figure 5B:
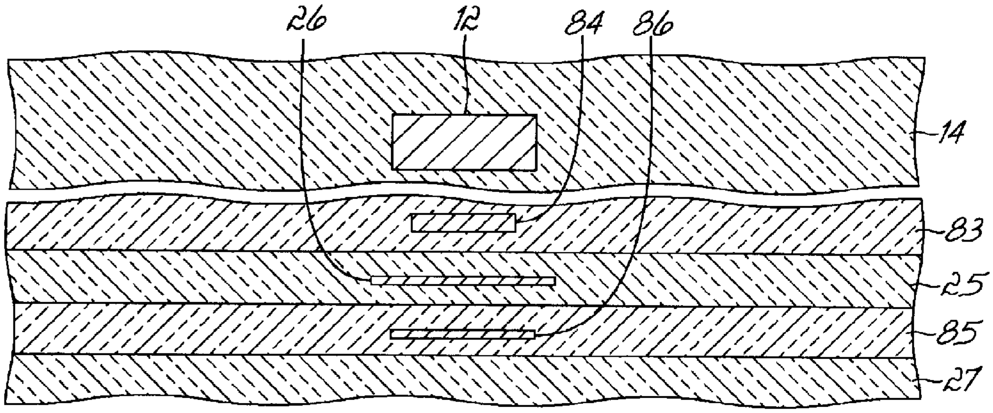

With reference to FIGS. 5A, 5B in which like reference numerals refer to like features in FIGS. 1A, 1B and in accordance with an alternative embodiment of the invention, an on-chip integrated variable inductor 82 modifies the construction of inductor 10 (FIGS. 1A, 1B) to incorporate a stack of ground lines by introducing ground lines 84, 86 in addition to ground line 26. Ground lines 84, 86, as well as ground line 26, are disposed between the signal line 12 and the substrate 16. Similar to ground line 26, ground lines 84, 86 are linear strips of a conductive material that are buried in insulating layers 83, 85, respectively, such that ground line 84 is between ground line 26 and signal line 12 and ground line 26 is between the ground line 84, 86. Insulating layers 83, 85 are similar to insulating layers 14, 25 and are stacked with insulating layer 25. Ground line 84 may reside in a metallization level between the metallization levels containing signal line 12 and ground line 26, and ground line 26 may reside in a metallization level between the metallization levels containing ground lines 84, 86. For example, signal line 12 may be a metal line disposed an M6-level, the ground line 86 may be a metal line disposed in an M2-level, ground line 26 may be a metal line disposed in an M3-level, and ground line 84 may be a metal line disposed in an M4-level.

The ground lines 84, 86 are electrically isolated from each other, from ground line 26, and from signal line 12 by portions of at least the insulating layers 14, 25, 83, 85. The ground lines 84, 86 are also formed by the same BEOL process techniques and from the same BEOL metallurgy as ground line 26. Ground lines 84, 86 can have dimensional relationships with the signal line 12 similar to the dimensional relationships between signal line 12 and ground line 26. However, each of the ground lines 86, 84, 86 can have different widths and/or thicknesses, as diagrammatically indicated on FIGS. 5A, 5B.

Opposite ends of the ground line 84 constitute contacts 88, 90 that are electrically coupled in a selective manner by control units 92, 94, respectively, in a current path with ground. Opposite ends of the ground line 86 constitute contacts 96, 98 that are electrically coupled in a selective manner by control units 100, 102, respectively, in another current path with ground. Control units 92, 94 and control units 100, 102, which have a construction analogous to the control units 32, 34, operate to selectively couple the respective ground lines 84, 86 with ground, when concurrently closed, in a manner similar to the operation of control units 32, 34 with respect to ground line 86. Control units 92, 94, 100, 102 may be located on substrate 16 and coupled with the respective ground lines 84, 86 by conductive paths (not shown) similar to conductive paths 31, 33 (FIG. 1B). For simplicity of illustration, conductive paths 21, 23, 31, 33 are omitted from FIG. 5B.

Operation of control units 32, 34, control units 92, 94, and control units 100, 102 is effective to alter the inductance of inductor 82 by coupling the ground lines 86, 84, 86 individually with a ground potential or, alternatively, by coupling different combinations of the ground lines 86, 84, 86 with the ground potential. When one or more of the sets of control units 32, 34, control units 92, 94, or control units 100, 102 are closed, the proximity of the grounded one or more of the ground lines 86, 84, 86 to the signal line 12 reduces the inductance of the inductor 82. The number of different reductions in the inductance is proportional to the number of switched ground lines 86, 84, 86. For example, the selective grounding of ground lines 26, 84, 86 permit the inductor 82 to have eight different inductance values that can be selected by merely opening and closing control units 32, 34, control units 92, 94, and control units 100, 102.

The inductance of inductor 82 is maximized when none of the ground lines 26, 84, 86 is coupled with ground. Coupling one or more of the ground lines 26, 84, 86 to ground operates to reduce the inductance of inductor 82. If the ground line 84 closest to the signal line 12 is coupled with ground and ground line 84 is as wide as, or wider than, either of the underlying ground lines 26 and 86, the inductance of inductor 82 is minimized regardless of whether or not either of the ground lines 26, 86 is also coupled with ground.

Inductor 82 may further include additional ground lines (not shown) in the same metallization level as one or more of the ground lines 26, 84, 86, similar to ground lines 26, 40, 42 of inductor 38 (FIGS. 2A, 2B). Alternatively, inductor 82 may further include additional ground lines (not shown) in the same metallization level as the signal line 12, similar to ground lines 62, 64 of inductor 60 (FIGS. 3A, 3B).

With reference to FIGS. 6A, 6B in which like reference numerals refer to like features in FIGS. 1A, 1B and in accordance with an alternative embodiment of the invention, an on-chip integrated variable inductor 104 otherwise similar to inductor 10 (FIGS. 1A, 1B) incorporates a capacitance shield 106. The capacitance shield 106 is disposed in insulating layer 83 between the signal line 12 and the ground line 26 and, therefore, resides in a metallization level between the metallization levels containing signal line 12 and ground line 26. For example, signal line 12 may be a metal line disposed an M6-level, the capacitance shield 106 may be a metal line disposed in an M3-level, and the ground line 26 may be a metal line disposed in an M2-level. The signal line 12, ground line 26, and capacitance shield 106 are electrically isolated from each other by portions of at least the insulating layers 14, 25, 83. The capacitance shield 106 is also formed by the same BEOL process techniques forming signal and ground lines 12, 26 and from the same or similar BEOL metallurgy. For simplicity of illustration, conductive paths 21, 23, 31, 33 are omitted from FIG. 6B.

Capacitance shield 106 includes a plurality of substantially identical segments 108 electrically linked together in a serpentine shape. The segments 108 are constructed and arranged to define gaps so that the capacitance shield 106 does not resemble a continuous ground plane or sheet and so that switching the ground line 26 can influence the inductance of the signal line 12 in the presence of the capacitance shield 106. The capacitance shield 106 is continuously tied to ground and, therefore, is not selectively switched.

Capacitance shield 106 reduces the capacitive coupling between the signal line 12 and the substrate 16, which endows the inductor 104 with a similar Q factor for the two different states of the ground line 26. In addition, the capacitance shield 106 helps provide isolation of the signal line 12 of the inductor 104 from the rest of the circuits in the integrated circuit on substrate 16. In an alternative embodiment, the capacitance shield 106 may have a comb shape.

Figure 7A:
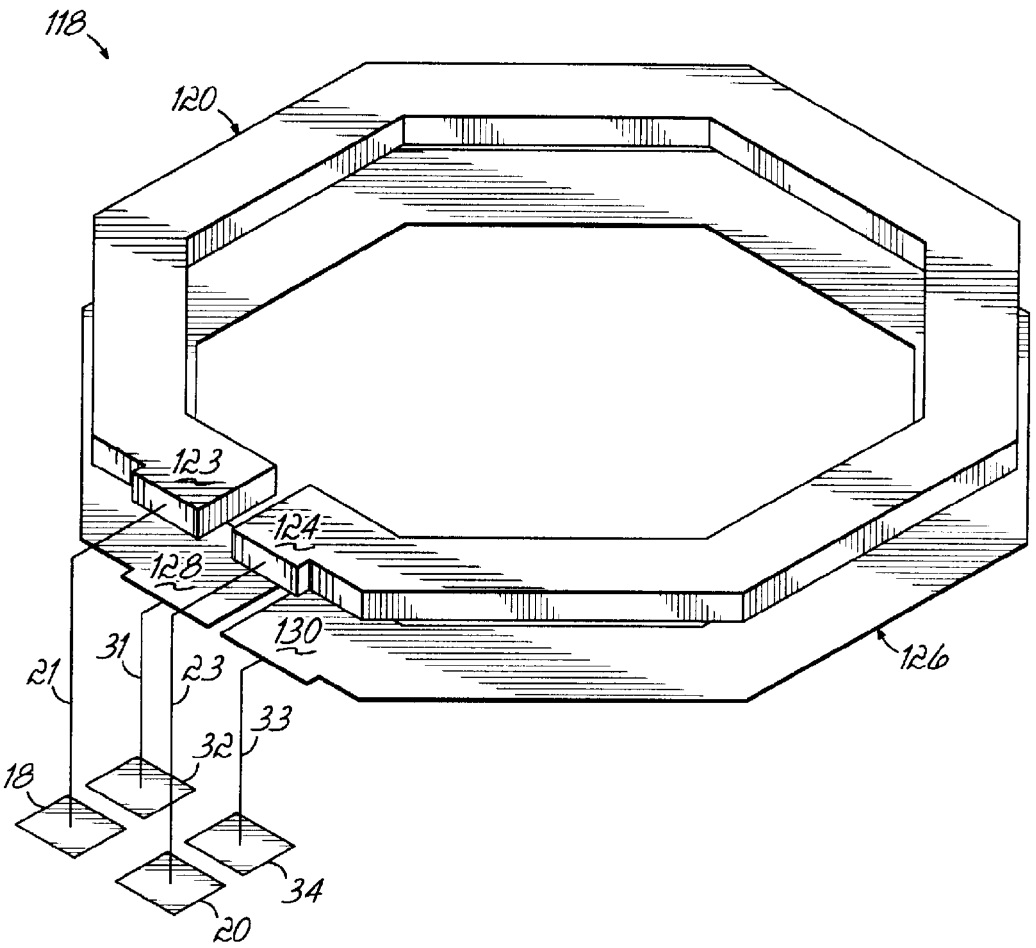
FIG. 7A is perspective view of an on-chip integrated variable inductor constructed with a spiral-shaped signal line and a switched spiral-shaped ground line in accordance with an embodiment of the invention and in which the surrounding dielectric material is omitted for clarity.
Figure 7B:
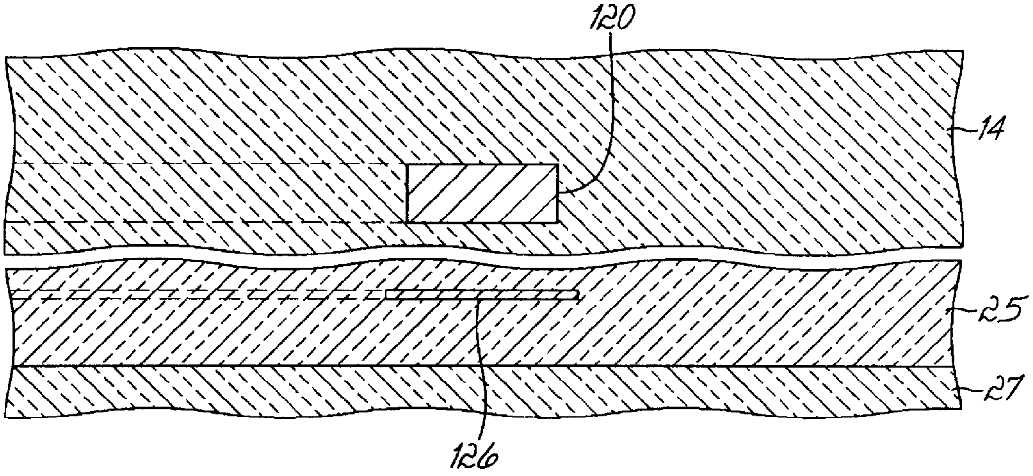
FIG. 7B is a cross sectional view of the inductor of FIG. 7A.

With reference to FIGS. 7A, 7B in which like reference numerals refer to like features in FIGS. 1A, 1B and in accordance with an alternative embodiment of the invention, an on-chip integrated variable inductor 118 includes a spiral-shaped signal line 120 and a spiral-shaped ground line 126 that is disposed between the signal line 120 and the substrate 16. The signal and ground lines 120, 126 are each formed from a planar strip of a conductive material, similar to signal and ground lines 12, 26 (FIGS. 1A, 1B). Signal line 120 is buried in and surrounding by insulating layer 14 and, similarly, ground line 126 is buried in and surrounded by insulating layer 25. The spiral shapes of the signal and ground lines 120, 126 are substantially identical. Ports or terminals 123, 124, which are located at opposite ends of the signal line 120, are electrically coupled by conductive paths 21, 23 with the features 18, 20 of the integrated circuit on the substrate 16.

Ground line 126, which generally underlies the signal line 120, is separated from the signal line 120 by portions of the insulating layers 14, 25, which supply electrical isolation. The signal line 120 and ground line 126 are formed in different metallization levels by conventional BEOL process techniques and from conventional BEOL metallurgy used in such process techniques, as described herein with regard to signal and ground lines 12, 26 (FIGS. 1A, 1B). For example, signal line 120 may be disposed an M5-level or an M6-level and the ground line 126 may be disposed in an M2-level closer to the substrate 16. The signal and ground lines 120, 126 may include additional concentrically-arranged planar spiral lines (not shown) with drop-down vias and underpasses as understood by a person having ordinary skill in the art. The signal and ground lines 120, 126 are depicted in FIG. 7A as having a polygonal shape and, in the representative embodiment, an octagonal shape. However, the signal and ground lines 120, 126 may alternatively be wound as a spiral having a rectangular, circular, or elliptical shape, or as a polygon with a different number of sides.

Opposite ends of the ground line 126 constitute contacts 128, 130 that are electrically coupled in a selective manner by control units 32, 34, respectively, in a current path with ground. Contacts 128, 120 are physically coupled with control units 32, 34 by conductive paths 31, 33. When both control units 32, 34 are switched open by appropriate voltage control signals, the ground line 126 is an open circuit and electrically floating. When the control units 32, 34 are in the open state, the floating ground line 126 does not significantly alter the inductance of the signal line 120. When both control units 32, 34 are closed by appropriate voltage control signals, the ground line 126 is in a closed current path coupled by a short circuit to a ground potential. In an alternative embodiment, one of the contacts 128, 130 of the ground line 126 may be continuously tied with ground and only the other of the contacts 128, 130 of the ground line 126 switched to complete the closed circuit to the ground potential.

Operation of the control units 32, 34 is effective to alter the inductance of inductor 118 by selectively coupling the ground line 126 with the ground potential. When the control units 32, 34 are closed and the ground line 126 is electrically coupled in the current path with ground, the proximity of the ground line 126 to the signal line 120 reduces the inductance of the inductor 118. The reduction is binary in that the inductor 118 has a first inductance value when the control units 32, 34 are switched open and a second inductance value, which is less than the first inductance value, when the control units 32, 34 are switched closed. When the control units 32, 34 are closed, the ground line 126 is not in the signal path of the inductor 118. Inductor 118 is electronically tunable in that the control units 32, 34 can be opened and closed during the operation of the integrated circuit on substrate 16.

Figure 8A:
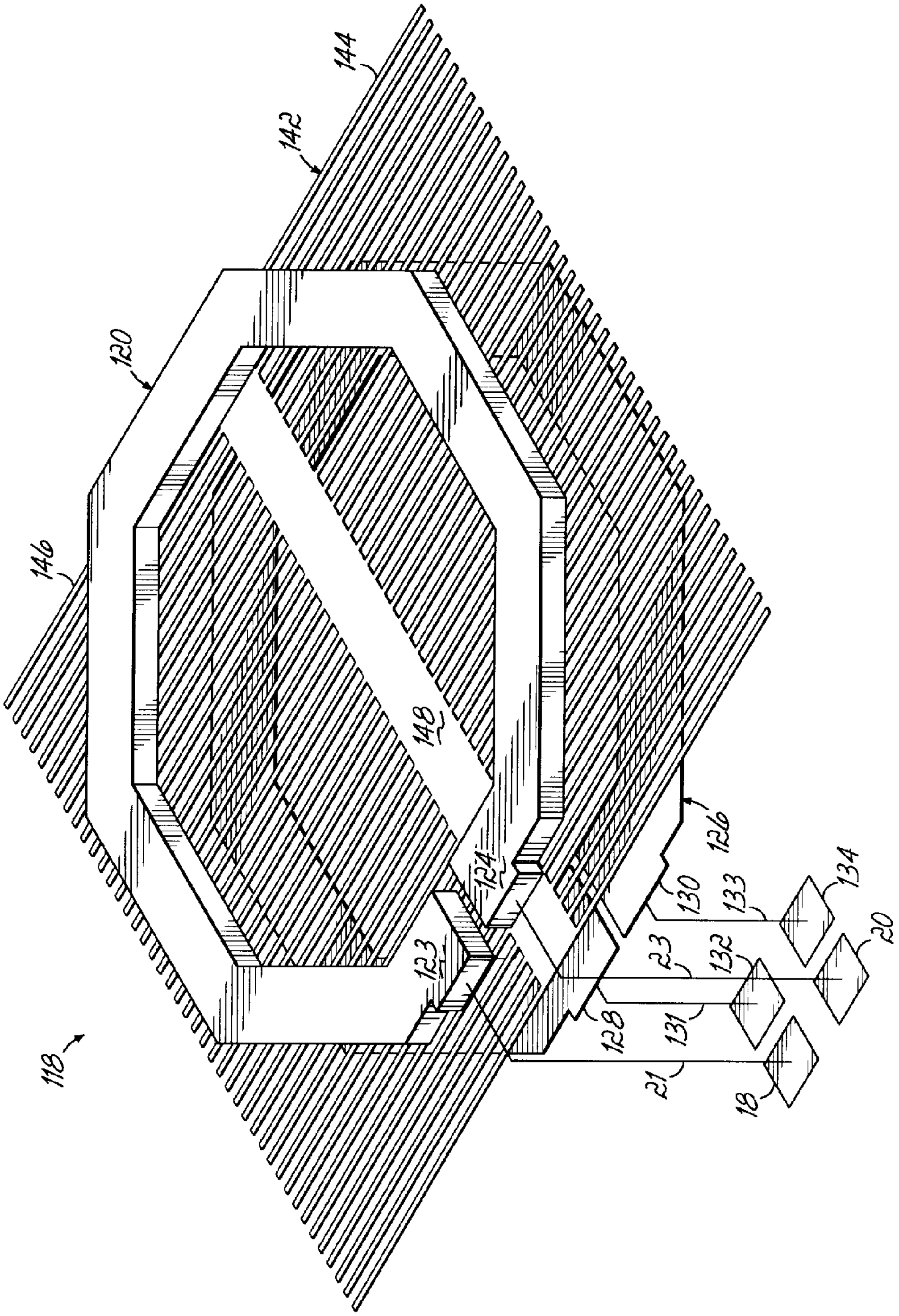
FIGS. 8A and 8B are perspective and cross-sectional views similar to FIGS. 7A and 7B of an on-chip integrated variable inductor constructed in accordance with an alternative embodiment of the invention and in which a capacitance shield is disposed between the signal and ground lines.
Figure 8B:
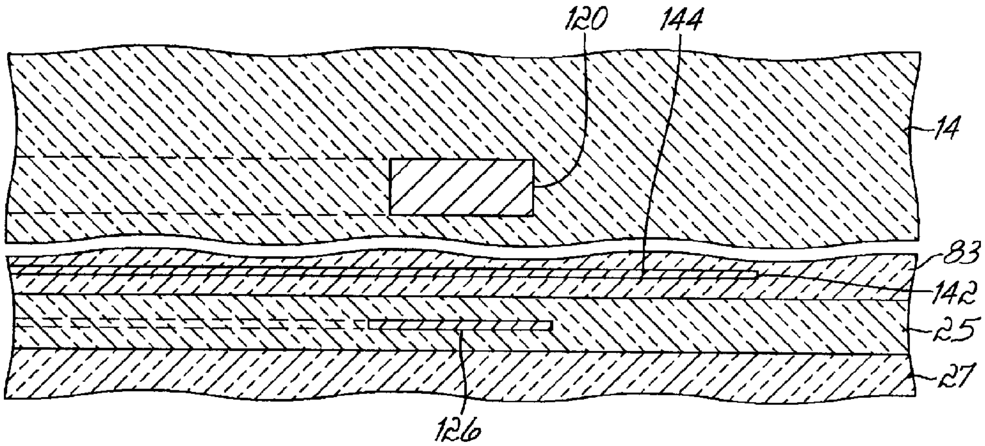

With reference to FIGS. 8A, 8B in which like reference numerals refer to like features in FIGS. 1A, 1B and in accordance with an alternative embodiment of the invention, an on-chip integrated variable inductor 140 otherwise similar to inductor 118 (FIGS. 7A, 7B) incorporates a capacitance shield 142. The capacitance shield 142 is disposed in a metallization level between the signal line 120 and the ground line 126. The capacitance shield 142 is disposed in insulating layer 83 between the signal line 120 and the ground line 126 and, therefore, resides in a metallization level between the metallization levels containing signal line 120 and ground line 126. For example, signal line 120 may be a metal line disposed an M6-level, the capacitance shield 142 may be a metal line disposed in an M3-level, and the ground line 126 may be a metal line disposed in an M2-level. The signal line 120, ground line 126, and capacitance shield 142 are electrically isolated from each other by portions of the insulating layers 14, 83, 122. The capacitance shield 142 is also formed by the same BEOL process techniques forming signal and ground lines 120, 126 and from the same or similar BEOL metallurgy. For simplicity of illustration, conductive paths 21, 23, 31, 33 are omitted from FIG. 8B.

Capacitance shield 142 includes a plurality of substantially identical parallel line segments or fingers in the form of shield lines 144, 146 that extend from opposite side edges of a central bridge 148. Each adjacent pair of shield lines 144, 146 is separated by a gap so that the capacitance shield 142 does not define a continuous ground plane or sheet and so that switching the ground line 126 can influence the inductance of the signal line 120 in the presence of the capacitance shield 142. The capacitance shield 142 is continuously tied to ground.

Capacitance shield 142 reduces capacitive coupling between the signal line 120 and the substrate 16 to endow the inductor 140 with an optimized Q factor. In addition, the capacitance shield 142 helps provide isolation of the signal line 120 of the inductor 140 from the rest of the circuits in the integrated circuit on substrate 16. Alternatively, the capacitance shield 142 can have a different pattern of conductive features, such as found in a radial type shield, so long as the shield lines are oriented perpendicular to the signal line 120.

Figure 9:
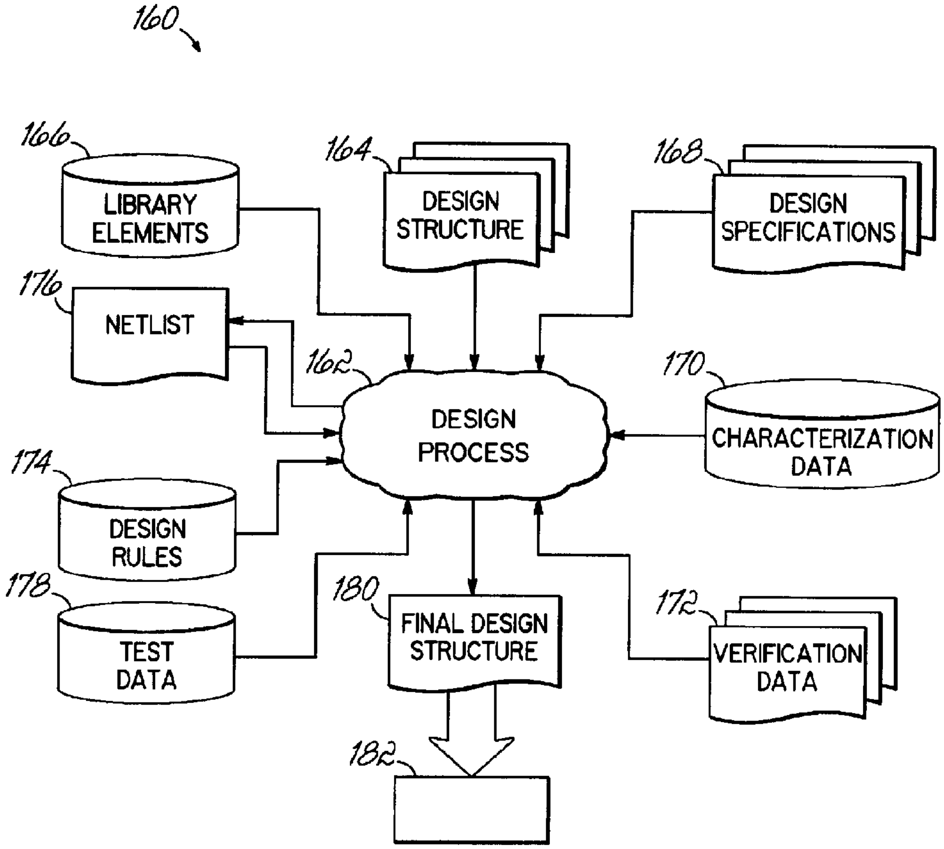
FIG. 9 is a block diagram of an example design flow.

FIG. 9 shows a block diagram of an example design flow 160 for manufacturing an integrated circuit. Design flow 160 may vary depending on the type of integrated circuit being designed. For example, a design flow 160 for building an application specific integrated circuit (ASIC) will differ from a design flow 160 for designing a standard component. Design structure 164 is an input to a design process 162 and may come from an intellectual property (IP) provider, a core developer, or other design company. Design structure 164 comprises one or more of the on-chip integrated variable inductors 10, 38, 60, 81, 82, 104, 118, or 140 in the form of schematics and layouts or a hardware description language (HDL), such as VHDL or Verilog. An HDL representation of an integrated circuit is analogous in many respects to a software program, as the HDL representation generally defines the logic or functions to be performed by a circuit design. Design structure 164 may be on one or more of machine readable medium as described below in the context of FIG. 10. For example, design structure 164 may be a text file or a graphical representation of an integrated circuit including one or more of the on-chip integrated variable inductors 10, 38, 60, 81, 82, 104, 118, or 140. Design process 162 synthesizes (or translates) the integrated circuit including one or more of the on-chip integrated variable inductors 10, 38, 60, 81, 82,

104, 118, or 140 into a netlist 176, where netlist 176 is, for example, a list of fat wires, transistors, logic gates, control circuits, I/O, models, etc. and describes the connections to other elements and circuits in an integrated circuit design and recorded on at least one of machine readable medium.

Design process 162 includes using a variety of inputs; for example, inputs from library elements 166 which may house a set of commonly used elements, circuits, and devices, including models, layouts, and symbolic representations, for a given manufacturing technology (e.g., different technology nodes, 32 nm, 45 nm, 90 nm, etc.), design specifications 168, characterization data 170, verification data 172, design rules 174, and test data files 178, which may include test patterns and other testing information. Design process 162 further includes, for example, standard circuit design processes such as timing analysis, verification tools, design rule checkers, place and route tools, etc. One of ordinary skill in the art of integrated circuit design can appreciate the extent of possible electronic design automation tools and applications that may be used in alternative embodiments of the design process 162.

Design process 162 ultimately translates the circuit including one or more of the on-chip integrated variable inductors 10, 38, 60, 81, 82, 104, 118, or 140, along with the rest of the integrated circuit design (if applicable), into a final design structure 180 (e.g., information stored in a GDS storage medium). Final design structure 180 may comprise information such as test data files, design content files, manufacturing data, layout parameters, wires, levels of metal, vias, shapes, test data, data for routing through the manufacturing line, and any other data required by a semiconductor manufacturer to produce a circuit containing one or more of the on-chip integrated variable inductors 10, 38, 60, 81, 82, 104, 118, or 140. Final design structure 180 may then proceed to a stage 182 of design flow 160; where stage 182 is, for example, where final design structure 180 proceeds to tape-out, is released to manufacturing, is sent to another design house, or is returned to the customer.

Figure 10:
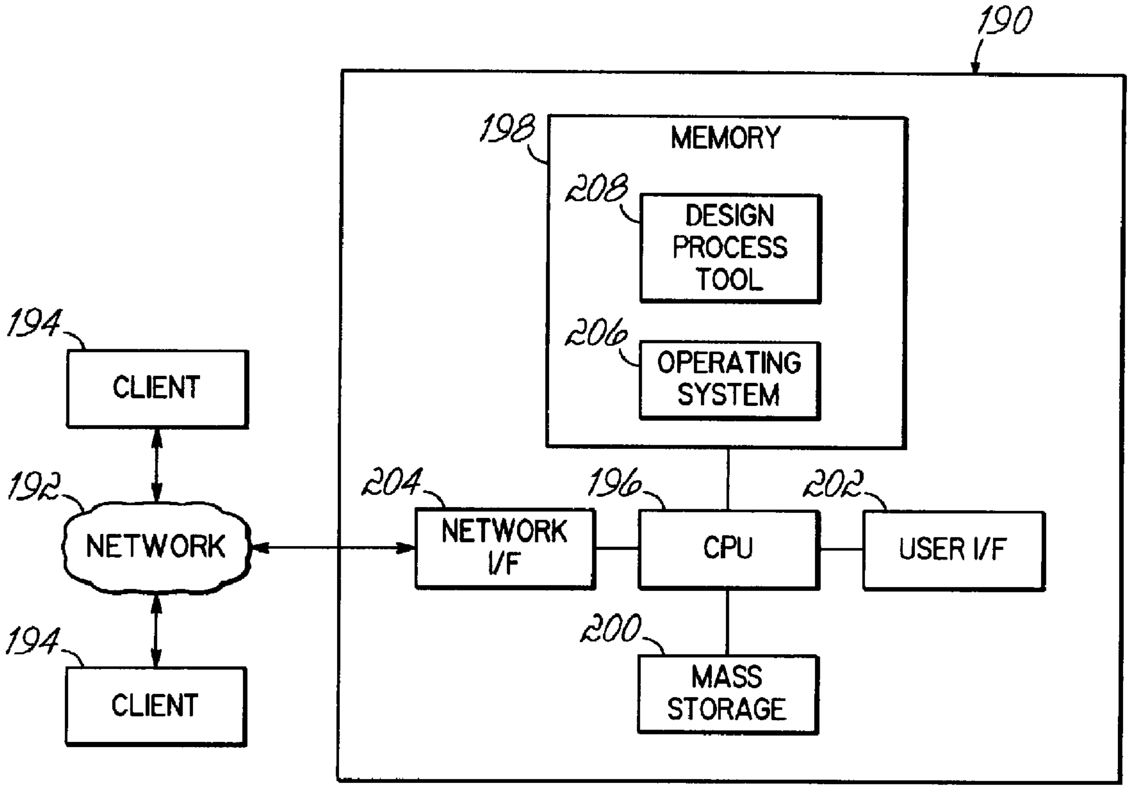
FIG. 10 is a block diagram of the principal hardware components in a computer system suitable for implementing the process of FIG. 9.

FIG. 10 next illustrates an apparatus 190 within which the various steps in the design process 162 may be performed. Apparatus 190 in the illustrated embodiment is implemented as a server or multi-user computer that is coupled via a network 192 to one or more client computers 194. For the purposes of the invention, each computer 190, 194 may represent practically any type of computer, computer system or other programmable electronic device. Moreover, each computer 190, 194 may be implemented using one or more networked computers, e.g., in a cluster or other distributed computing system. In the alternative, computer 190 may be implemented within a single computer or other programmable electronic device, e.g., a desktop computer, a laptop computer, a handheld computer, a cell phone, a set top box, etc.

Computer 190 typically includes a central processing unit (CPU) 196 including at least one microprocessor coupled to a memory 198, which may represent the random access memory (RAM) devices comprising the main storage of computer 190, as well as any supplemental levels of memory, e.g., cache memories, non-volatile or backup memories (e.g., programmable or flash memories), read-only memories, etc. In addition, memory 198 may be considered to include memory storage physically located elsewhere in computer 190, e.g., any cache memory in a processor in CPU 196, as well as any storage capacity used as a virtual memory, e.g., as stored on a mass storage device 200 or on another computer coupled to computer 190. Computer 190 also typically receives a number of inputs and outputs for communicating information externally. For interface with a user or operator, computer 190 typically includes a user interface 202 incorporating one or more user input devices (e.g., a keyboard, a mouse, a trackball, a joystick, a touchpad, and/or a microphone, among others) and a display (e.g., a CRT monitor, an LCD display panel, and/or a speaker, among others). Otherwise, user input may be received via another computer or terminal.

For additional storage, computer 190 may also include one or more mass storage devices 200, e.g., a floppy or other removable disk drive, a hard disk drive, a direct access storage device (DASD), an optical drive (e.g., a CD drive, a DVD drive, etc.), and/or a tape drive, among others. Furthermore, computer 190 may include an interface 204 with one or more networks 192 (e.g., a LAN, a WAN, a wireless network, and/or the Internet, among others) to permit the communication of information with other computers and electronic devices. It should be appreciated that computer 190 typically includes suitable analog and/or digital interfaces between CPU 196 and each of components 198, 200, 202 and 204 as is well known in the art. Other hardware environments are contemplated within the context of the invention.

Computer 190 operates under the control of an operating system 206 and executes or otherwise relies upon various computer software applications, components, programs, objects, modules, data structures, etc., as will be described in greater detail below. Moreover, various applications, components, programs, objects, modules, etc. may also execute on one or more processors in another computer coupled to computer 190 via network 192, e.g., in a distributed or client-server computing environment, whereby the processing required to implement the functions of a computer program may be allocated to multiple computers over a network.

In general, the routines executed to implement the embodiments of the invention, whether implemented as part of an operating system or a specific application, component, program, object, module or sequence of instructions, or even a subset thereof, will be referred to herein as "computer program code," or simply "program code." Program code typically comprises one or more instructions that are resident at various times in various memory and storage devices in a computer, and that, when read and executed by one or more processors in a computer, cause that computer to perform the steps necessary to execute steps or elements embodying the various aspects of the invention. Moreover, while the invention has and hereinafter will be described in the context of fully functioning computers and computer systems, those skilled in the art will appreciate that the various embodiments of the invention are capable of being distributed as a program product in a variety of forms, and that the invention applies equally regardless of the particular type of machine readable medium used to actually carry out the distribution. Examples of machine readable medium include but are not limited to tangible, recordable type media such as volatile and non-volatile memory devices, floppy and other removable disks, hard disk drives, magnetic tape, optical disks (e.g., CD-ROMs, DVDs, etc.), among others, and transmission type media such as digital and analog communication links.

In addition, various program code described hereinafter may be identified based upon the application within which it is implemented in a specific embodiment of the invention. However, it should be appreciated that any particular program nomenclature that follows is used merely for convenience, and thus the invention should not be limited to use solely in any specific application identified and/or implied by such nomenclature. Furthermore, given the typically endless number of manners in which computer programs may be organized into routines, procedures, methods, modules, objects, and the like, as well as the various manners in which program functionality may be allocated among various software layers that are resident within a typical computer (e.g., operating systems, libraries, API's, applications, applets, etc.), it should be appreciated that the invention is not limited to the specific organization and allocation of program functionality described herein.

To implement the various activities in design process 162 of FIG. 9, computer 190 includes a number of software tools, including, for example, a design process tool 208. Other tools utilized in connection with integrated circuit design, verification and/or testing may also be utilized in computer 190. Moreover, while design process tool 208 is shown in a single computer 190, it will be appreciated by one of ordinary skill in the art having the benefit of the instant disclosure that typically these tools will be disposed in separate computers, particularly where multiple individuals participate in the logic design, integration and verification of an integrated circuit design. Therefore, the embodiments of the invention are not limited to the single computer implementation that is illustrated in FIG. 10.

Those skilled in the art will recognize that the exemplary environment illustrated in FIGS. 9 and 10 is not intended to limit the embodiments of the invention. Indeed, those skilled in the art will recognize that other alternative hardware and/or software environments may be used.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The term "vertical" refers to a direction perpendicular to the horizontal, as just defined. Terms, such as "on", "above", "below", "side" (as in "sidewall"), "upper", "lower", "over", "beneath", and "under", are defined with respect to the horizontal plane. It is understood that various other frames of reference may be employed for describing the invention without departing from the spirit and scope of the invention. It is also understood that features of the invention are not necessarily shown to scale in the drawings. Furthermore, to the extent that the terms "includes", "having", "has", "with", or variants thereof are used in either the detailed description or the claims, such terms are intended to be inclusive in a manner similar to the term "comprising."

While the invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A structure comprising:

a chip including an integrated circuit and an interconnect structure for said integrated circuit, said interconnect structure including a first metallization level, a second metallization level different from said first metallization level, a first conductive path coupled with a ground potential, and a second conductive path coupled with the ground potential;

a signal line of an inductor disposed in said first metallization level of said interconnect structure, said signal line electrically coupled with said integrated circuit for communication of an electrical signal;

a first ground line of said inductor disposed in said first metallization level of said interconnect structure or in said second metallization level of said interconnect structure, said first ground line positioned proximate to said signal line, said first ground line having a first end and a second end opposite to said first end, said first end of said first ground line coupled with said first conductive path, and said second end of said first ground line coupled with said second conductive path; and at least one control unit included in said integrated circuit, said at least one control unit disposed in said first conductive path, said at least one control unit configured to selectively open and close said first conductive path, wherein said signal line has a first inductance value when said first conductive path is open, and said signal line has a second inductance value when said first conductive path is closed such that said first end of said first ground line is coupled by the first conductive path with the ground potential and said second end of said first ground line is coupled by the second conductive path with the ground potential.

2. The structure of claim 1 wherein said first ground line is located between said signal line and said integrated circuit.

3. The structure of claim 1 wherein said signal line is a first planar spiral winding, and said first ground line is a second planar spiral winding that underlies said first planar spiral winding.

4. The structure of claim 1 wherein said signal line is a first planar conductive line, and said first ground line is a second planar conductive line disposed in a spaced relationship with said first planar conductive line.

5. The structure of claim 1 further comprising:

a dielectric material surrounding said signal line and said first ground line, a portion of said dielectric material disposed between said signal line and said first ground line to prevent electrical conduction between said signal line and said first ground line.

6. The structure of claim 1 further comprising:

a capacitance shield disposed between said first ground line and said signal line.

7. The structure of claim 1 further comprising:

a second ground line positioned proximate to said signal line, said second ground line configured to be selectively coupled in a second current path with the ground potential, said second current path electrically isolated from said first current path, and said signal line having a third inductance value when said second ground line is coupled with the ground potential.

8. The structure of claim 7 wherein said interconnect structure includes a third metallization level disposed between said first metallization level and said second metallization level, said first ground line is contained in said second metallization level, said second ground line is contained in third metallization level, and said first ground line, said second ground line, and said signal line have a stacked arrangement in which between said second ground line is disposed vertically between said first ground line and said signal line.

9. The structure of claim 7 wherein said first ground line, said second ground line, and said signal line are contained said first metallization level, and said signal line is disposed laterally between said first ground line and said second ground line.

10. The structure of claim 7 wherein said first ground line and said second ground line are contained in said second metallization level.

11. The structure of claim 7 further comprising:

a third ground line positioned proximate to said signal line, said third ground line configured to be selectively coupled in a third current path with the ground potential, said third current path electrically isolated from said first and second current paths, and said signal line having a fourth inductance value when said third ground line is coupled with the ground potential.

12. The structure of claim 11 wherein said first ground line, said second ground line, and said signal line are contained in said first metallization level, and said third ground line is disposed in said second metallization level.

13. The structure of claim 1 wherein the ground line is a first linear strip, and the signal line is a linear strip aligned substantially parallel to the first linear strip.

14. The structure of claim 13 wherein the ground line is thinner than the signal line.

15. The structure of claim 13 wherein the ground line and the signal line have approximately equal lengths.

16. The structure of claim 1 wherein the ground line and the signal line have equivalent geometrical shapes.

17. The structure of claim 1 wherein said first ground line of said inductor is disposed in said second metallization level of said interconnect structure, and said second metallization level is located between said first metallization level and said integrated circuit.

18. A method of making a structure, the method comprising:

fabricating an integrated circuit on a semiconductor substrate to form a chip;

after the integrated circuit is fabricated, fabricating an interconnect structure on the chip, the interconnect structure including a first metallization level with a signal line of an inductor that is electrically coupled with the integrated circuit, a first conductive path coupled with a ground potential, and a second conductive path coupled with the ground potential; and fabricating a first ground line of the inductor in the first metallization level of the interconnect structure or in a second metallization level of the interconnect structure that is proximate to the signal line, wherein the first ground line is fabricated with a first end and a second end opposite to said first end, the first end of the first ground line is coupled with the first conductive path, the second end of the first ground line coupled with the second conductive path, the integrated circuit includes at least one control unit configured for selectively opening and closing the first conductive path said at least one control unit configured to selectively open and close said first conductive path, said signal line has a first inductance value when said first conductive path is open, and said signal line has a second inductance value when said first conductive path is closed such that said first end of said first ground line is coupled by the first conductive path with the ground potential and said second end of said first ground line is coupled by the second conductive path with the ground potential.

19. The method of claim 18 wherein the first ground line and the signal line are fabricated in the first metallization level.

20. The method of claim 18 further comprising:

fabricating a second ground line sufficiently proximate to the signal line such that the signal line has a third inductance value when the second ground line is coupled in a second current path with the ground potential and the second inductance value when the second current path is open; and fabricating at least one control unit in the integrated circuit that is configured for selectively opening and closing the second current path.

21. A design structure embodied in a machine readable medium for designing and manufacturing a circuit, the circuit comprising:

a chip including an integrated circuit and an interconnect structure for said integrated circuit, said interconnect structure including a first metallization level, a second metallization level different from said first metallization level, a first conductive path coupled with a ground potential, and a second conductive path coupled with the ground potential;

a signal line of an inductor disposed in said first metallization level of said interconnect structure, said signal line electrically coupled with said integrated circuit for communication of an electrical signal;

a first ground line of said inductor disposed in said first metallization level of said interconnect structure or in said second metallization level of said interconnect structure, said first ground line positioned proximate to said signal line, said first ground line having a first end and a second end opposite to said first end, said first end of said first ground line coupled with said first conductive path, and said second end of said first ground line coupled with said second conductive path; and at least one control unit included in said integrated circuit, said at least one control unit disposed in said first conductive path, said at least one control unit configured to selectively open and close said first conductive path, wherein said signal line has a first inductance value when said first conductive path is open, and said signal line has a second inductance value when said first conductive path is closed such that said first end of said first ground line is coupled by the first conductive path with the ground potential and said second end of said first ground line is coupled by the second conductive path with the ground potential.

22. The design structure of claim 21 wherein said signal line is a first planar spiral winding and said ground line is a second planar spiral winding that underlies said first planar spiral winding.

23. The design structure of claim 21 wherein said signal line is a first planar conductive line and said ground line is a second planar conductive line disposed in a spaced relationship with said first planar conductive line.

24. The design structure of claim 21 wherein said circuit further comprises:

a capacitance shield disposed between said ground line and said signal line.

25. The design structure of claim 21 wherein said at least one control unit is configured to operate upon receipt of a control voltage signal to selectively open and close said current path.

26. The design structure of claim 21 wherein said at least one control unit is selected from the group consisting of field effect transistors, positive-intrinsic-negative diodes, and combinations thereof.

* * * * *